US011946972B2

(12) United States Patent
Joos et al.

(10) Patent No.: US 11,946,972 B2
(45) Date of Patent: Apr. 2, 2024

(54) MONITORING OF INTERCONNECT LINES

(71) Applicant: SEMICONDUCTOR COMPONENTS INDUSTRIES, LLC, Phoenix, AZ (US)

(72) Inventors: Dieter Jozef Joos, Nieuwenrode (BE); Yves Renard, Sterrebeek (BE)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 439 days.

(21) Appl. No.: 17/188,058

(22) Filed: Mar. 1, 2021

(65) Prior Publication Data

US 2022/0043057 A1 Feb. 10, 2022

Related U.S. Application Data

(60) Provisional application No. 63/061,931, filed on Aug. 6, 2020.

(51) Int. Cl.
*G01R 31/3177* (2006.01)
*B60R 16/023* (2006.01)
(Continued)

(52) U.S. Cl.
CPC ...... *G01R 31/3177* (2013.01); *B60R 16/0232* (2013.01); *G01R 31/58* (2020.01);
(Continued)

(58) Field of Classification Search
CPC ............... G01R 31/3177; G01R 31/58; B60R 16/0232; G06F 13/4027; G06F 13/4068; H04B 1/02; H04B 1/06
(Continued)

(56) References Cited

U.S. PATENT DOCUMENTS 6,208,571 B1 * 3/2001 Ikeda ............... G01R 31/31717
365/201
6,303,875 B1 10/2001 Hata
(Continued)

FOREIGN PATENT DOCUMENTS

EP 3151123 A1 4/2017
WO 2013144001 A1 10/2013

OTHER PUBLICATIONS

Sadeghi-Kohan et al., BS 1149.1 Extensions for an Online Interconnect Fault Detection and Recovery, 2012, IEEE, pp. 1-9. (Year: 2012).*

(Continued)

*Primary Examiner* — John J Tabone, Jr.
(74) *Attorney, Agent, or Firm* — Brake Hughes Bellermann LLP

(57) ABSTRACT

Devices, systems and methods for monitoring interconnect lines may include operations for transmitting, by a transmit block to a receive block, a first signal over a first interconnect line; executing, by the transmit block, a first transmit logic operation on the first signal with respect to a second signal, on at least one second interconnect line to generate a transmit signal; receiving, by the transmit block, a receive signal resulting from a receive logic operation executed by the receive block on a received first signal on the first interconnect line with respect to a received second signal received on at least one second interconnect line; executing, by the transmit block, a second transmit logic operation on the transmit signal with respect to the receive signal; and generating, by the transmit block and based on the executing of the second transmit logic operation, a result signal.

20 Claims, 6 Drawing Sheets

(51) Int. Cl.
  *G01R 31/58* (2020.01)
  *G06F 13/40* (2006.01)
  *H04B 1/02* (2006.01)
  *H04B 1/06* (2006.01)

(52) U.S. Cl.
  CPC ...... *G06F 13/4027* (2013.01); *G06F 13/4068* (2013.01); *H04B 1/02* (2013.01); *H04B 1/06* (2013.01)

(58) Field of Classification Search
  USPC ................ 714/732, 735, 742, 727, 729, 718
  See application file for complete search history.

(56) References Cited

U.S. PATENT DOCUMENTS

| | | | |
|---|---|---|---|
| 6,570,531 B1 | 5/2003 | Stratton | |
| 6,681,355 B1* | 1/2004 | Gion | G01R 31/318575 714/740 |
| 8,732,632 B1* | 5/2014 | Keller | G01R 31/31855 716/101 |
| 8,933,447 B1* | 1/2015 | Rahman | G01R 31/318513 257/797 |
| 11,289,893 B2* | 3/2022 | Joos | H02H 3/08 |
| 2003/0229835 A1* | 12/2003 | Whetsel | G01R 31/318541 714/727 |
| 2005/0080581 A1* | 4/2005 | Zimmerman | G11C 29/02 702/117 |
| 2005/0165970 A1* | 7/2005 | Ching | G06F 13/4072 710/1 |
| 2007/0011536 A1* | 1/2007 | Khanna | G06F 11/27 714/E11.169 |
| 2007/0022333 A1* | 1/2007 | Terry | G11C 29/022 714/718 |
| 2007/0182440 A1* | 8/2007 | Cha | G09G 3/006 324/760.01 |
| 2011/0038083 A1 | 2/2011 | Coln | |
| 2011/0142112 A1 | 6/2011 | Lin et al. | |
| 2012/0139549 A1 | 6/2012 | Sufrin-Disler et al. | |
| 2015/0124363 A1 | 5/2015 | Garbossa | |
| 2015/0304648 A1 | 10/2015 | Gulati | |
| 2015/0331040 A1 | 11/2015 | Bernon-Enjalbert et al. | |
| 2016/0341780 A1* | 11/2016 | McLeod | G01R 31/67 |
| 2019/0340047 A1* | 11/2019 | Bowling | G01R 31/31717 |
| 2020/0118642 A1* | 4/2020 | Fuoco | G06F 11/1004 |
| 2020/0343009 A1 | 10/2020 | Clarkson | |
| 2022/0043057 A1* | 2/2022 | Joos | B60R 16/0232 |

OTHER PUBLICATIONS

Niamat et al., A BIST Scheme for Testing the Interconnects of SRAM-Based FPGAs, 2002, IEEE, pp. 41-44. (Year: 2002).*
Tehranipour et al., Testing SoC Interconnects for Signal Integrity Using Extended JTAG Architecture, 2004, IEEE, pp. 800-811. (Year: 2004).*
Whetsel, Adapting JTAG for AC Interconnect Testing, 2003, IEEE, pp. 96-105. (Year: 2003).*
Attarha et al., Testing Interconnects for Noise and Skew in Gigahertz SoCs, 2001, IEEE, pp. 305-314. (Year: 2001).*
U.S. Appl. No. 16/718,484, Non-Final Office Action, dated Nov. 1, 2021.
U.S. Appl. No. 16/718,484, Response to Non-Final Office Action, dated Jan. 20, 2022.
U.S. Appl. No. 16/718,484, Non-final Office Action, dated Apr. 13, 2021.
U.S. Appl. No. 16/718,484, Non-final Office Action Response, dated Jun. 23, 2021.
Kurt Shuler, "The ABCs of ISO 26262", Dec. 18, 2014, p. 17, Publisher: https://semiengineering.com/the-abcs-of-iso-26262/.
John Favaro, "Experience with ISO26262 ASIL Decomposition", "http://www.aAutomotive SPIN", Feb. 17, 2011, p. 27, Publisher: http://www.automotive-spin.it/uploads/8/8W_favaro.pdf, Published in: Milano Italy.
Jitin George, "C200 MCU SafeTI Control Solutions: An introduction to ASIL decomposition and SIL synthesis", "Chttp://www.ti.com/lit/wp/sway028/sway028.pdf", 201904, p. 9, Publisher: Texas Instruments, Published in: Dallas, US.
U.S. Appl. No. 16/718,484, filed Dec. 18, 2019.
U.S. Appl. No. 16/718,484, Final Office Action, dated Jul. 14, 2021.
U.S. Appl. No. 16/718,484, RCE and Response to Final Office Actioe, dated Sep. 30, 2021.

* cited by examiner

FIG. 5A

DETERMINING, BY THE THRID TRANSMIT LOGIC, WHETHER A FAILURE INDICATION IS PRESENT IN THE RESULT SIGNAL DURING THE GIVEN CLOCK PERIOD
514

DETERMINING, BY THE THRID TRANSMIT LOGIC, WHETHER AN IGNORE SIGNAL IS BEING RECEIVED BY THE THIRD TRANSMIT LOGIC AND, WHEN PRESENT, RESETTING THE THRID TRANSMIT LOGIC
516

GENERATING, BY THE THIRD TRANSMIT LOGIC, WHILE THE IGNORE SIGNAL IS NOT PRESENT, A SET/RESET SIGNAL INDICATING WHETHER, DURING THE GIVEN CLOCK PERIOD, THE GIVEN INTERCONNECT LINE FAILS TRANSIENT FAULT DIAGNOSTIC MONITORING
518

FIG. 5B

MONITORING OF INTERCONNECT LINES

CROSS REFERENCE TO RELATED APPLICATIONS

The present application claims priority to U.S. Provisional Application Ser. No. 63/061,931, filed on Aug. 6, 2020, in the name of inventors Dieter Jozef Joos and Yves Renard, and entitled, "Method and Apparatus for Diagnostic Testing on Digital Interconnect Lines," the entire contents of which are incorporated herein by reference.

TECHNICAL FIELD

The technology described herein generally relates to automotive and other functional safety standards and devices and systems utilized to comply with such standards. More specifically, the technology described herein relates to devices, systems, and methods for detecting faults on interconnect lines used in coupling control components with safety components.

BACKGROUND

Today, automotive systems need to comply with various functional safety standards. Such standards include the International Organization for Standardization's (ISO) ISO 26262-1:2018 standard and earlier versions thereof. Similarly, other standards apply to other forms of vehicles including the DAL standard used for aircraft. The various implementations of the present description are directed to automotive standards and may be applied to other standards. These standards typically require an automotive system to provide a safety mechanism that is capable of monitoring and responding to a fault, such as a single point failure, arising in a safety function. One implementation of devices, systems, and apparatus for meeting such safety requirements is described in U.S. patent application Ser. No. 16/718,484, which was filed on 18 Dec. 2019, in the name of inventor Dieter Jozef Joos, and is entitled "Device, Systems and Methods for Avoiding Fault Propagation in Safety Systems", the entire contents of which are incorporated herein by reference.

In short, fault analysis involves the use of safety goals and safety measures, which are designed to reduce the probability of one or more faults occurring to an acceptable risk level. A fault can be defined by one or more safety goals which, when satisfied, avoid an occurrence of the fault. Safety measures are used in furtherance of a safety goal and are accomplished by "safety critical components" including one more "safety functions" (SF) which are monitored by one or more "safety mechanisms" (SM). A safety mechanism is essentially one or more technical measures that are provided to detect, mitigate, control, avoid and ensure that a given safety goal(s) is accomplished by a given, one or more safety function(s). A safety mechanism provides a predetermined response that is performed when a fault is detected in a safety critical component. Safety mechanism(s), when failures in one or more safety functions are detected, often result in a vehicle being configured into a "safe state" (also referred to as a "fail safe" state), and/or a functional state that proceeds as a different operating level (often referred to as a "fail functional" state).

For example, faults may occur in interconnect lines which couple digital control components to analog safety components. Examples of such faults may include transient faults and permanent faults. Accordingly, devices, systems, and methods for diagnostic monitoring of digital interconnect lines are needed which will enhance compliance by a system with one or more safety requirements, such as ASIL requirements. The various implementations of the present disclosure address such needs.

SUMMARY

The various implementations of the present disclosure describe devices, systems, and methods for monitoring of interconnect lines.

In accordance with at least one implementation of the present disclosure a method, for monitoring of interconnect lines, may include one or more of the following operations: transmitting, by a transmit block to a receive block, a first signal over a first interconnect line; executing, by the transmit block, a first transmit logic operation on the first signal with respect to a second signal on at least one second interconnect line to generate a transmit signal; receiving, by the transmit block, a receive signal resulting from a receive logic operation executed by the receive block on a received first signal on the first interconnect line with respect to a received second signal received on at least one second interconnect line; and executing, by the transmit block, a second transmit logic operation on the transmit signal with respect to the receive signal; and generating, by the transmit block and based on the executing of the second transmit logic operation, a result signal.

Implementations may include one or more of the following features. The first interconnect line and at least one second interconnect line may form an interconnect bus coupling the transmit block with the receive block. Detection of permanent faults on the interconnect bus may be facilitated. Delayed execution of the second transmit logic operation for at least two or more clock periods may be facilitated. The first transmit logic operations may include an Exclusive OR (XOR) operation. The receive logic operation may include a second XOR operation. The second transmit logic operation may include a third XOR operation. The first transmit logic operation may include an AND operation. The receive logic operation may include a second AND operation. The second transmit logic operation may include an OR operation. Debouncing of the result signal a given number of clock periods may be facilitated. The debouncing may filter failure indicators out of the result signal for the given number of clock periods. The first interconnect line may include a long interconnect line. The debouncing of the result signal may account for a round-trip signal propagation delay arising over the first interconnect line. The first interconnect line may provide data signals which facilitates operation of at least one safety component. The first interconnect line may include a metal interconnect. Compliance with ASIL-D safety requirement may be satisfied for the at least one safety component. The transmit block may include a digital block and the receive block may include an analog block.

In accordance with at least one implementation, a method, for monitoring interconnect lines, may include one or more of the following operations: transmitting, by a transmit block to a receive block, a first signal over a first interconnect line; executing, by the transmit block, a first transmit logic operation on the first signal with respect to a second signal on at least one second interconnect line to generate a transmit signal; receiving, by the transmit block, a receive signal resulting from a receive logic operation executed by the receive block on a received first signal on the first interconnect line with respect to a received second signal received on at least one second interconnect line; executing, by the transmit block, a second transmit logic operation on the transmit signal with respect to the receive signal; generating, by the transmit block and based on the executing of the second transmit logic operation, a result signal; receiving, by a third transmit logic and during a given clock period, the result signal; determining, by the third transmit logic, whether a failure indication is present in the result signal during the given clock period; determining, by the third transmit logic, whether an ignore signal is being received by the third transmit logic during the given clock period, and when the ignore signal is present, resetting the third transmit logic; and generating, by the third transmit logic, a set/reset signal indicating whether, during the given clock period, the ignore signal is not present while the failure indication is present in the result signal.

Implementations may include one or more of the following features. The first transmit logic may execute an Exclusive OR (XOR) operation. The receive logic may execute a second XOR operation. The second transmit logic may execute a third XOR operation. The third transmit logic may execute a set/reset latch operation. The first interconnect line and at least one second interconnect line may form an interconnect bus coupling the transmit block with the receive block. The detection of transient faults on the interconnect bus may be facilitated. The first interconnect line may include a long interconnect line. Delaying, for at least two or more clock periods, a providing of the ignore signal to the third transmit logic may be facilitated. The delaying of the providing of the ignore signal to the third transmit logic may account for a round-trip signal propagation delay arising over the first interconnect line and a return path. The first interconnect line may provide data signals which facilitate operation of at least one safety component. The first interconnect line may include a metal interconnect. Compliance with an Automotive Safety Integrity Level D (ASIL-D) safety requirement may be satisfied for the safety component.

In accordance with at least one implementation, a system, for monitoring of interconnect lines, may include: a transmit block; a receive block; and an interconnect bus coupling the transmit block with the receive block. The interconnect bus may include: a first interconnect line and one or more second interconnect lines. The transmit block may include: a second transmit logic operable to detect a permanent fault on the first interconnect line by comparing a transmit signal with a receive signal. The transmit signal may be generated by the transmit block, and the receive signal may be generated by the receive block. A permanent fault may be detected by the second transmit logic when, for a given clock period, the transmit signal and the receive signal do not correspond.

Implementations may include one or more of the following features. The transmit block may include a first transmit logic operable to generate the transmit signal by comparing a first reference signal for the first interconnect line with one or more second reference signals for the one or more second interconnect lines. The receive block may include a receive logic operable to generate the receive signal by comparing a first data on the first interconnect line with one or more second data on the one or more second interconnect lines. The first interconnect line may include a long interconnect line and the transmit block may include a debouncer circuit operable to filter failure indicators out of the result signal for two or more clock periods. The first transmit logic may be configured to execute a first Exclusive OR (XOR) operation to compare the first reference signal with the one or more second reference signals and generate the transmit signal. The receive logic may be configured to execute a third XOR operation to compare the first data with the one or more second data to generate the receive signal. The second transmit logic may execute a second XOR operation to compare the transmit signal with the receive signal and generate the result signal.

BRIEF DESCRIPTION OF THE DRAWINGS

The features, aspects, advantages, functions, modules, and components of the devices, systems and processes provided by the various implementations of the present disclosure are further disclosed herein regarding at least one of the following descriptions and accompanying drawing figures. In the appended figures, similar components or elements of the same type may have the same reference number and may include an additional alphabetic designator, such as 108a-108n, and the like, wherein the alphabetic designator indicates that the components bearing the same reference number, e.g., 108, share common properties and/or characteristics. Further, various views of a component may be distinguished by a first reference label followed by a dash and a second reference label, wherein the second reference label is used for purposes of this description to designate a view of the component. When the first reference label is used in the specification, the description is applicable to any of the similar components and/or views having the same first reference number irrespective of any additional alphabetic designators or second reference labels.

FIGS. 5A and 5B are a flow chart illustrating one method for diagnostic monitoring of interconnect lines for transient faults and in accordance with at least one implementation of the present disclosure.

DETAILED DESCRIPTION

The various implementations described herein are directed to devices, systems, and methods for diagnostic monitoring of digital interconnect lines.

As discussed above, faults may occur in interconnect lines which couple digital control components to analog safety components. Examples of digital control components include memory devices, controllers, and the like which may be used to control operating states of safety functions and/or safety mechanisms. Interconnect line may be used to interconnect two or more components of one or more vehicle system. Non-limiting examples of uses of interconnect lines include: (i) an interconnect line on a PCB; (ii) an interconnect line on a chip carrier (within a multichip module); (iii) a bondwire; (iv) an interconnect between two stacked integrated circuits (ICs) (such as a processor and a memory), such as a bump or in a wafer bonded arrangement; (v) a combination of one or more of the foregoing; or (vi) other known or later arising electrical, electro-magnetic, and/or optical interconnections of system components.

Figure 1:
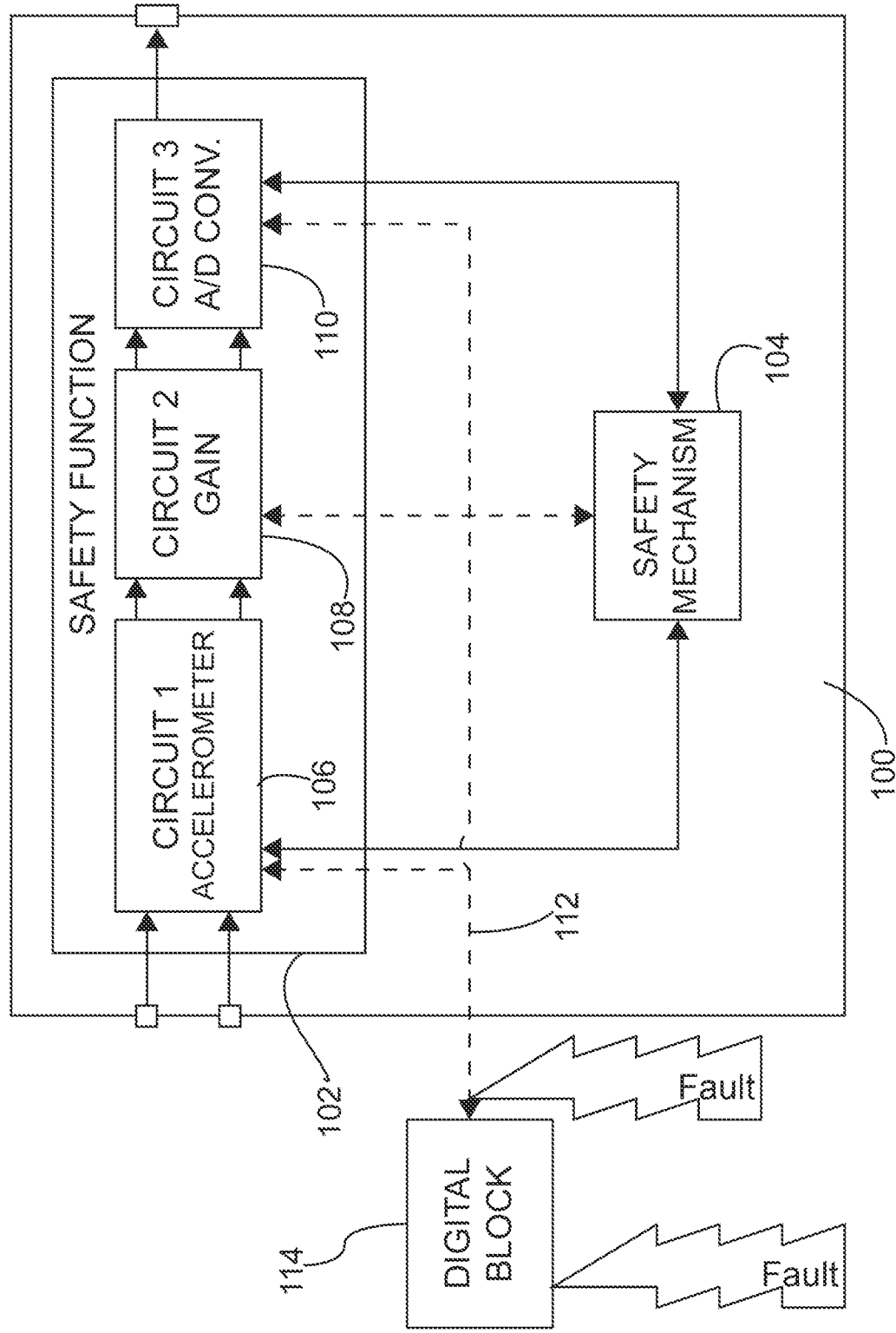
FIG. 1 is an illustrative representation of relationships between vehicle systems, safety functions, and safety mechanisms.

As shown in FIG. 1 and used herein, a vehicle system 100 may include various digital control components. Such digital control components are commonly referred to as a components of a "transmit block" 114 and analog safety mechanisms 104 and safety functions 102 are commonly referred to as components of an "receive block." A single point failure in an interconnect line 112 may result in a control signal transmitted by a component of a transmit block 114 not being received by one or more receive block components, and vice versa. Such failure may result in a fault that disables, or otherwise results in an undesired response, in one or more of safety functions and one or more safety mechanisms. Non-limiting examples of safety functions may include in a circuit 1 an accelerometer stage 106, in a circuit 2 a gain stage 108, and in a circuit 3 an analog to digital A/D converter stage 110.

For example, a transmit block 114 may be coupled by an interconnect line 112 to a receive block component, such as a safety function 102 and/or a safety mechanism 104. The interconnect line 112 may be used to communicate control input signals, such as a clock, reset, supply, or other signals. A fault on the interconnect line 112 may result in a fault arising with respect to the safety component(s) used for one or more vehicle systems 100. Often, interconnect lines 112 may have a higher probability of failure than other similarly sized components within an integrated circuit (IC) or between two or more ICs, such as two or more ICs on a printed circuit board (PCB). Such an interconnect line may be referred to herein as being a "long interconnect" and further defined to be any coupling between two or more components of a given system with respect to which a failure may arise thereon which would inhibit compliance by the given system with an appropriate ASIL requirement. Permanent faults and transient faults may arise on the interconnect lines 112. Examples of such faults include shorts to ground, adjacent line shorts, or other faults. Such faults may be difficult to detect using currently known approaches and commonly are not detected by a given safety mechanism 104.

Figure 2:
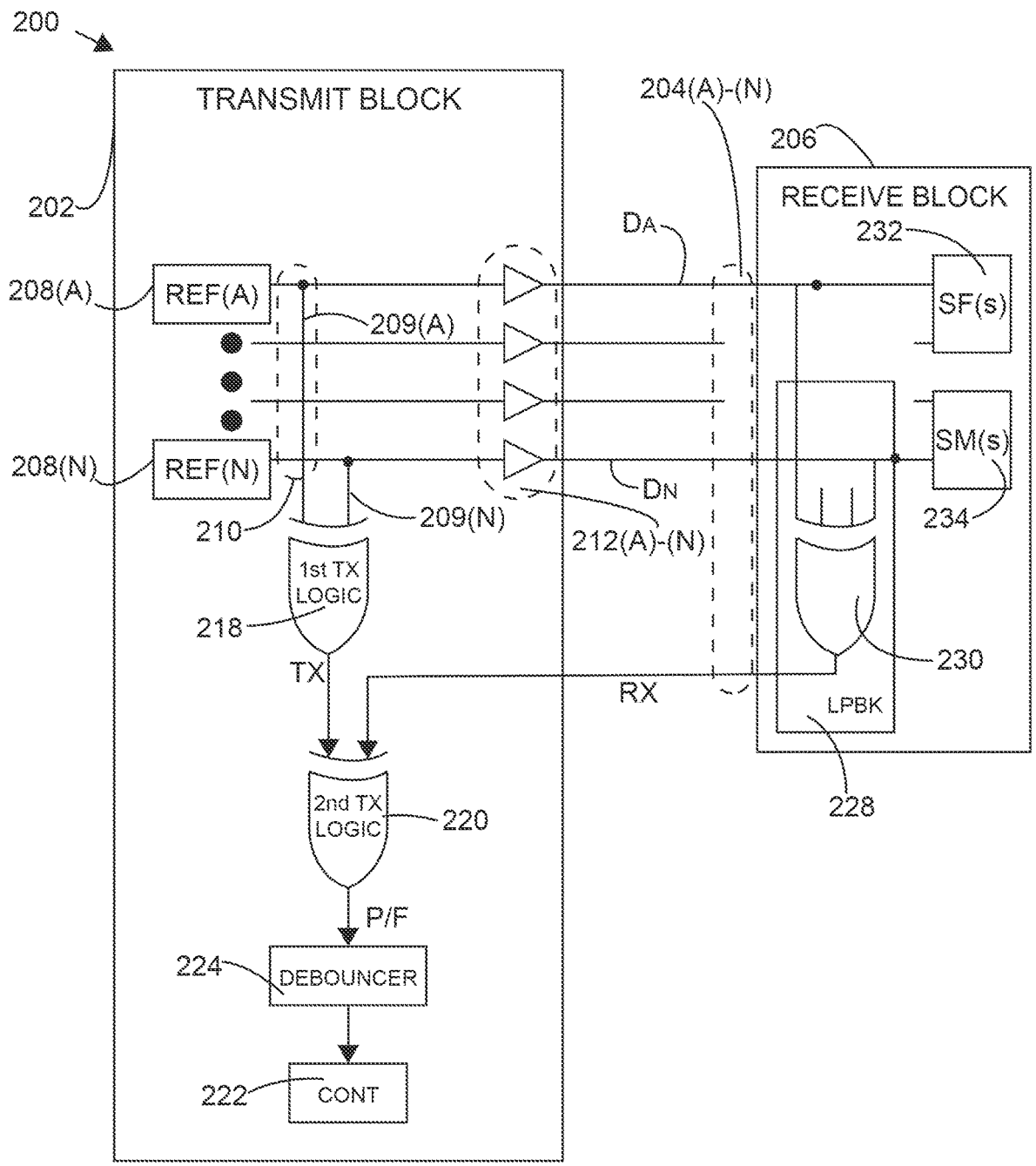
FIG. 2 is a schematic representation of a system for diagnostic monitoring of interconnect lines for permanent faults and in accordance with at least one implementation of the present disclosure.

As shown in FIG. 2, for at least one implementation of the present disclosure, a system is described for detecting permanent faults arising on digital interconnect lines (herein, a "permanent fault detecting system") 200. Permanent faults may be shorts or line interruptions which are not found, not active and/or not existing during monitoring of a system but may be and/or become active during the lifetime of the vehicle system 100. Upon detection of a permanent fault, a fault signal is transmitted to a system controller and/or a relevant block, component, module, or part thereof may be put into a non-active mode or into a safe state.

The permanent fault detecting system may include a transmit block 202 that is coupled by one or more interconnect lines 204(A)-(N), where "N" is an integer, to a receive block 206. As used herein, a collection of two or more interconnect lines is referred to as an "interconnect bus." For example, and not by limitation, the transmit block 202 may include one or more digital and/or analog devices, herein "reference components" 208(A)-208(N), that are configured to transmit data, as represented, for example, by data signals 209(A) to 209(N), in one or more of an analog and/or digital form, over one or more interconnect lines 204(A)-(N) to the receive block 206. The receive block 206 may include analog and/or digital devices configured to receive the transmitted data. Any combination of analog blocks and digital blocks may be used as one or more of the transmit block 202 and receive block 206. For example, and not by limitation, a transmit block 202 may be digital block while the receive block 206 is an analog block. Similarly, a transmit block 202 may be digital while the receive block 206 is digital. For at least one implementation, the transmit block 202 may be provided as a part of a first IC device and the receive block 206 may be provided as part of a second IC device. For at least one implementation, the transmit block 202 may be provided as a component a sensor IC and the receive block 206 may be provided as a component a controller unit (ECU).

For another implementation, the transmit block 202 may be a component of the controller unit (ECU), while the receive block 206 is component of a sensor IC. A sensor IC may include an IC configured to read out a sensor, process sensor signals, such as to amplify sensor signals, apply A/D conversions, perform calculations, and/or to output the processed signals in a transmit format for a specific interconnect bus.

For another implementation, the transmit block 202 may be a component in a controller and the receive block 206 may be a component of a memory device. It is to be appreciated that a given interconnect bus may communicate one or more of analog and/or digital data between the transmit block 202 and the receive block 206. Further, an interconnect line 204 may include one or more unidirectional and bi-directional lines. It is also to be appreciated that the respective signal transmissions may be reversed with respect to one or more interconnect lines 204, such that the receive block 206 may function as a transmitter while the transmit block 202 functions as a receiver. Diagnostic monitoring of bi-directional data flows over interconnect lines 204 may also be supported by implementations of the present disclosure.

The transmit block 202 and the receive block 206 may be provided in a single, given IC, as two or more ICs, or otherwise. The transmit block 202, receive block 206, and interconnect lines 204 may be fabricated on a single printed circuit board (PCB), on multiple PCBs, as single IC modules, multiple IC modules, and otherwise. The transmit block 202, receive block 206 and interconnect lines 204 may be fabricated using any known or later arising technologies. For example, and not by limitation, one or more of the interconnect lines 204 may be fabricated using wafer bonding technologies.

The transmit block 202 may include or be coupled to one or more reference components 208(A)-(N) which generate the data signals 209(A)-(N). For at least one implementation, a reference component 208 may include a data register. Non-limiting examples of reference components 208 may include memory gate arrays, control processors, oscillators, and other digital and/or analog components. Any number of reference components 208 may be used in a given implementation.

The data signals 209 may be provided over one or more reference lines 210 to one or more fault isolators 212(A)-(N). Four fault isolators 212(A)-(N) are shown in FIG. 2 purposes of illustration, and not by limitation. Any number of fault isolators 212 may be used for a given implementation. The fault isolators 212 may be used to provide electrical isolation between two or more interconnect lines 204.

For at least one implementation, a permanent fault detecting system 200 may include at least two reference components 208 generating data signals 209, coupled by at least two reference lines 210, to two or more fault isolators 212. The reference component(s) and fault isolator(s) 212 cooperatively facilitate a controlled transmitting of data signals 209 from the transmit block 202 to the receive block 206. For at least one implementation, the fault isolators 212 may include use of two invertors. For an implementation, the fault isolators 212 may include a use of switches, such as those provided by transistors, or other components.

As further shown and for at least one implementation, at least two or more of the reference lines 210 are grouped and further coupled, as a grouping, to a first transmit logic 218. In FIG. 2, an Exclusive OR (XOR) gate is shown as the first transmit logic 218 for purposes of illustration. In other implementations, other forms of logic gates may be used. The first transmit logic 218 outputs a "transmit signal" ("TX") to a second transmit logic 220. For at least one implementation, an XOR gate may be used as the second transmit logic 220.

For at least one implementation and based on the inputs received from the first transmit logic 218 and a "receive signal" ("RX") received from the receive block 206 (as described further below), the second transmit logic 220 outputs a "result signal" as one of a pass signal ("P") or a failure signal ("F") (shown as "P/F" in FIG. 2). For example, when TX≠RX, the second transmit logic 220 will output a Fail signal (F) and when TX=RX, the second transmit logic 220 will output a pass signal (P).

The result signal may be provided to a controller component 222 ("CONT" in FIG. 2). For at least one implementation, the controller component 222 may be provided with or separate from the transmit block 202. The controller component 222 may include any given configuration of processors, storage devices, or the like used in detecting, monitoring, or otherwise determining whether compliance with a given safety requirement is satisfied and, when faults are detected, configuring one or more vehicle systems in a given safe operating state.

When long interconnect lines are used to couple the transmit block 202 with the receive block 206, a round-trip signal propagation delay may arise between the sending of a data signal 209, by the transmit block 202, and a receiving the receive signal RX (from the receive block 206) that is longer than a clock period of a reference component generating the data signal 209. Such round-trip delay may result in the second transmit logic 220 receiving the receive signal RX after the transmit signal TX has changed state (e.g., from a high transmit signal TX corresponding to when a data signal 209 was transmitted, to a low transmit signal TX corresponding to a next clock period). To address such delays, as further shown in FIG. 2, the transmit block 202 may include an optional debouncer circuit 224. The debouncer circuit 224 may be used to account for round-trip signal propagation delays by filtering out Failure signals (F) generated during any such delay periods.

Should a need arise for multi-point fault detection, different and/or additional logical components may be used in one or more of the transmit block and the receive block to so facilitate.

Further, should a need arise for diagnostic monitoring of combinations of interconnect lines 204, it is to be appreciated that various combinations of logic components may be used for the first transmit logic 218, second transmit logic 220 and receive logic 230. For example and not by limitation, the first transmit logic 218 may include multiple AND gates that are appropriately coupled to the reference lines 210 such that any combination of two (or more) signals are provided to a given AND gate and such AND gates (or which an array thereof may be used in view of the number of data signals 209 available) are provided to an OR gate, with the outputs of such OR gate being provided to another OR gate which, effectively, performs the functions of the second transmit logic 220, while a similar configuration of an array of AND gates feed an OR gate and thereby perform the functions of the receive logic 230.

The receive block 206 further includes one or more safety components, such as a safety function (SF) 232 and a safety mechanism (SM) 234. The safety components may be provided to monitor one or more vehicle systems/modules and provide for compliance with a safety goal, such as an ASIL safety goal, as specified for such one or more vehicle systems/modules.

It is to be appreciated that the implementation of FIG. 2 may be useful in detecting permanent faults arising on one or more interconnect lines 204. For at least one implementation, transient faults may be additionally, and/or alternatively, detected. One non-limiting example of a transient fault is a register fault, where a data value in a register at a given time is faulty, while the data value in that register at a later time is not faulty. Another non-limiting example of a transient fault is a fault that occurs on an interconnect line 204 due to toggling. It is to be appreciated that transient faults may occur in the transmit block 202, on the interconnect lines 204, and/or in the receive block 206.

Figure 3:
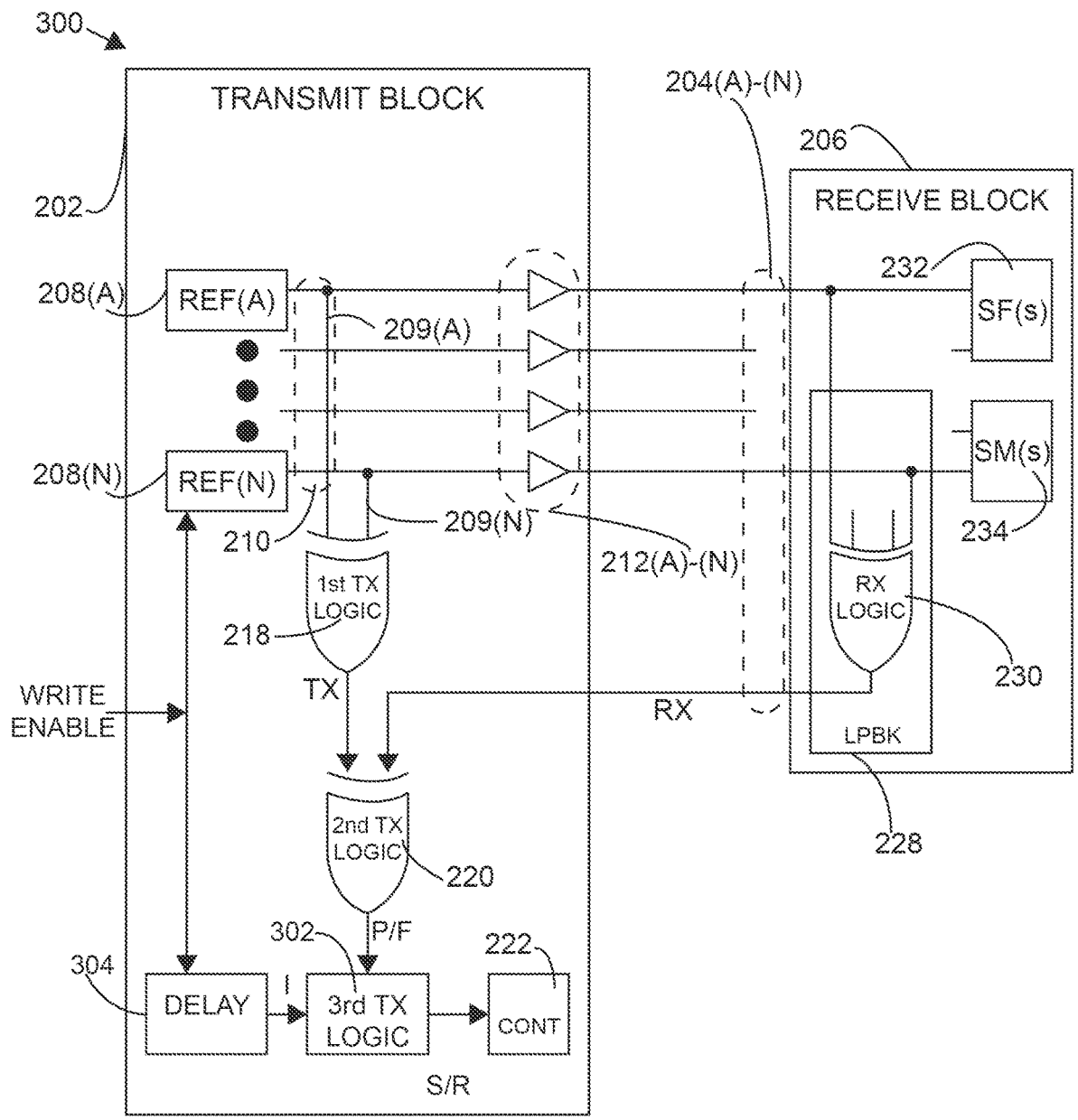
FIG. 3 is a schematic representation of a system for diagnostic monitoring of interconnect lines for transient faults and in accordance with at least one implementation of the present disclosure.

One non-limiting implementation for detecting transient faults is shown in FIG. 3. As shown, many of the components of a "transient fault detecting system" 300 are common to the permanent fault detecting system 200. The transient fault detecting system 300 may include a third transmit logic 302 that operates, for example, on a set/reset latch principle. A write enable signal may be provided to one or more of the reference components 208(A)-208(N) generating the one or more data signals 209(A)-209(N). The write enable signal may facilitate a providing of certain data in the data signals 209 from the reference component(s) 208 to the transmit logic buffer(s) and over the interconnect lines 204 to the receive block 206. For at least one implementation, the reference component(s) 208 generating the data signals 209 may include writable registers.

The write enable signal may be further provided to a delay circuit 304 that, for a given delay period, if any, outputs an ignore signal ("I") to the third transmit logic 302. The delay period may be selected based upon a round-trip signal propagation delay arising due to long interconnect lines in view of clocking frequencies. The ignore signal I may be provided to the third transmit logic 302 whenever the write enable signal toggles and for the given delay period. The ignore signal I may be used to mask any expected changes in the data signals 209 occurring during the delay period.

As for the above permanent fault detection implementations, the second transmit logic 220 generates a result signal (P/F). For a transient fault detection implementation, the result signal (P/F) may be provided to the third transmitter logic 302. Based on the values received in the result signal (P/F) and whether the reset indication signal (RI) is active (e.g., high), the third transmitter logic 302 may be configured to output a set/reset signal ("S/R" in FIG. 3) to the controller component 222. For example, when the result signals indicates a failure (F), and the ignore signal I is inactive, the third transmitter logic 302 will output in the set/reset signal a set "S" signal which indicates to the controller component CONT 222 that the given interconnect line being monitored failed a transient fault diagnostic test. By another example, when the result signal indicates a pass (P), and the ignore signal I is inactive, the third transmitter logic 320 will output in the set/reset signal a reset "R" signal which indicates to the controller component CONT 222 that the given interconnect line 204 being monitored passed a transient fault diagnostic test. By another example, when the ignore signal I is active, the third transmitter logic 320 will continue to output, in the set/reset S/R signal to the controller component 222, the previously indicated set S or reset R signal.

It is to be appreciated that the various implementations of the present disclosure facilitate that detecting of faults over interconnect lines with a single set (and not a duplicate set) of interconnect lines going to safety functions and safety mechanisms, as are commonly provided for various prior art systems.

At least one implementation may facilitate permanent fault detection while minimizing usage of surface areas on ICs by utilizing two new transmit logic components (the first transmit logic 218 and the second transmit logic 220) and, when available, by repurposing a use of existing receive logics, such as the receive logic 230. At least one implementation may facilitate compliance with ASIL D metrics.

For at least one implementation, a fault arising on an interconnect line 204 may be detected within two (2) clock periods (a "fast" detection). Such fast detection may facilitate fault detection before a receive block 206, such as an analog receive block, is able to react to the fault. At least one implementation facilitates fast permanent and/or transient fault detections of interconnect lines 204. Such fast fault detections may facilitate a system taking appropriate actions within a maximum fault handling time interval (MFHTI). As used herein, an MFHTI is an amount of time in which a system is allowed (while meeting safety requirements) to detect and react to a given fault before such given fault results in an unacceptable condition.

Figure 4:
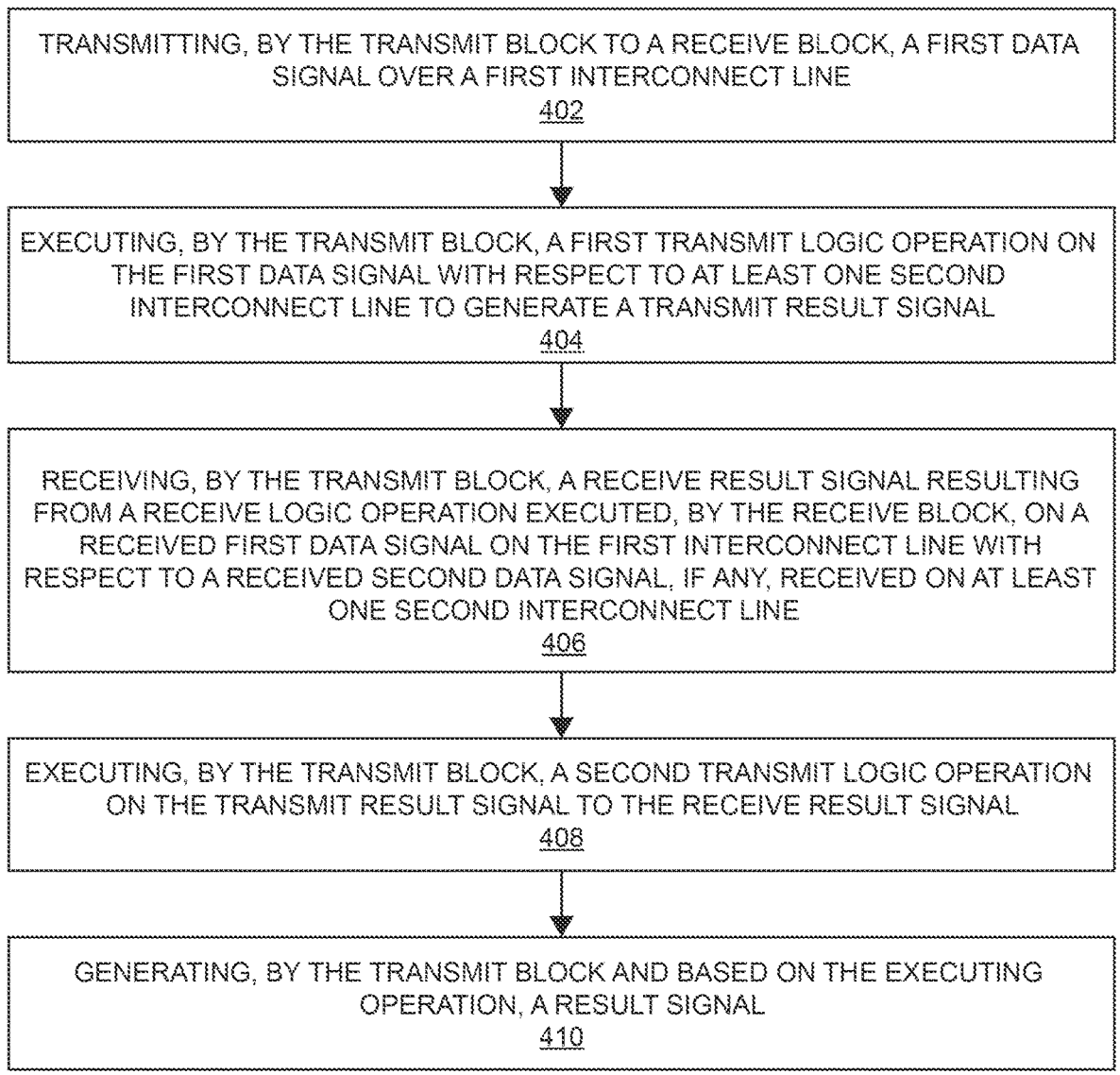
FIG. 4 is a flow chart illustrating one method for diagnostic monitoring of interconnect lines for permanent faults and in accordance with at least one implementation of the present disclosure.

As shown in FIG. 4, a method for diagnostic monitoring of interconnect lines 204 for permanent faults may include for at least one implementation of the present disclosure, per Operation 402, transmitting, by the transmit block 202 to the receive block 206, a first data signal 209(A) over a first interconnect line (e.g., 204(A)). It is to be appreciated that the first data signal 209(A) may originate from any reference component.

Per Operation 404, the method may include executing, by the transmit block 202, a first transmit logic operation on the first data signal 209(A), present on a first reference line 210(A), with respect to at least one second data signal 209(N), if any, present on a second reference line 210(N), to generate a transmit signal TX. For a non-limiting implementation where a single point failure is to be detected, the first transmit logic operation may include use of an XOR operation. For a non-limiting implementation where multi-point failures are to be detected, other logical operations may be used.

Per Operation 406, the method may include receiving, by the transmit block 202, a receive signal RX resulting from a receive logic operation executed, by the receive block 206, on a received first data signal 209(A) on the first interconnect line 204(A) with respect to a received second data signal 209(N), if any, received on at least one second interconnect line 204(N). For a non-limiting implementation where a single point failure is to be detected, the receive logic operation may include use of an XOR operation. For a non-limiting implementation where multi-point failures are to be detected, the receive logic operation may include use of at least one AND operation. Other logical operations may be used for other implementations.

Per Operation 408, the method may include executing, by the transmit block 202, a second transmit logic operation on the transmit signal TX with respect to the receive signal RX. For a non-limiting implementation where a single point failure is to be detected, the second transmit logic operation may include use of an XOR operation. For a non-limiting implementation where multi-point failures are to be detected, other logical operations may be used.

Per Operation 410, the method may include generating, by the transmit block 202 and based on the executing operation, a result signal (P/F). As discussed above, the result signal (P/F) may indicate whether the first interconnect line 204(A) passes or fails the diagnostic monitoring. The result signal (P/F) may be communicated to a controller component 222 that may be operable to execute a safety protocol in view of a failure of the diagnostic monitoring.

It is to be appreciated that the process of FIG. 4 may be useful in detecting permanent faults. Further, when long interconnect lines are being tested, the process may include executing a delay, by a debouncer circuit 224, for a given number of clock periods before Operation 408 and the second transmit logic operation are performed.

Figure 5A:
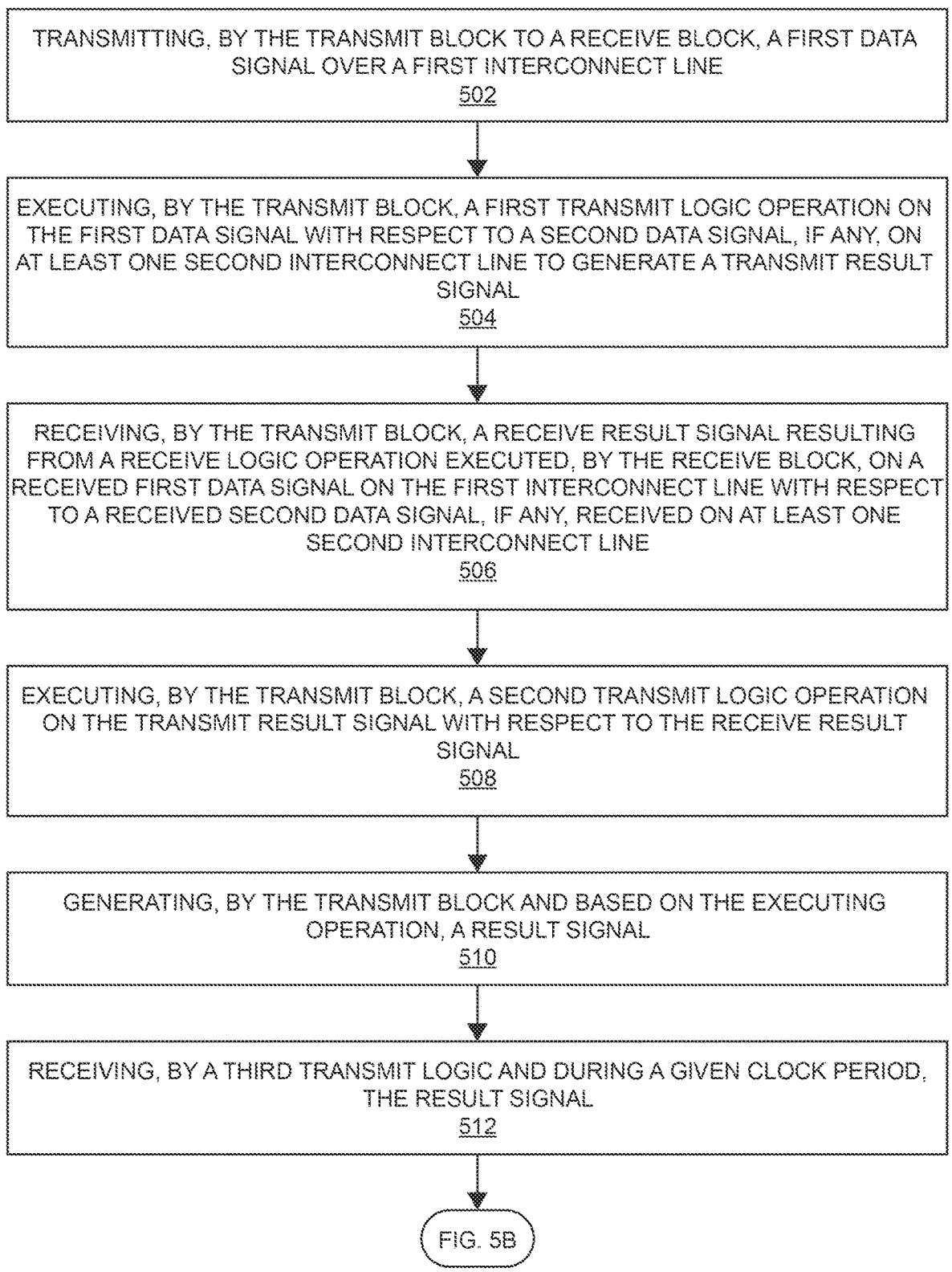

As shown in FIGS. 5A and 5B, a method for diagnostic monitoring of interconnect lines for transient faults may include for at least one implementation of the present disclosure, per Operation 502, transmitting, by the transmit block to a receive block, a first data signal 209(A) over a first interconnect line 204(A). It is to be appreciated that the first data signal 209(A) may originate from a first reference component 208(A). The first reference component 208(A) may be configured to generate the first data signal 209(A) when a write enable signal is received. As shown in FIG. 3, the write enable signal may also be provided to a delay circuit 304 which generates the ignore signal I for a given delay period, as described above.

Per Operation 504, the method may include executing, by the transmit block, a first transmit logic operation on the first data signal 209(A) with respect to a second data signal 209(N), if any, on at least one second interconnect line 204(N) to generate a transmit signal TX. For a non-limiting implementation where a single point failure is to be detected, the first transmit logic operation may include use of an XOR operation. For a non-limiting implementation where multi-point failures are to be detected, the first transmit logic operation may include use of at least one AND operation. Other logical operations may be used for other implementations.

Per Operation 506, the method may include receiving, by the transmit block 202, a receive signal RX resulting from a receive logic operation executed by the receive block 206 on a received first data signal 209(A) on the first interconnect line 204(A) with respect to a received second data signal 209(N), if any, received on at least one second interconnect line 204(N). For a non-limiting implementation where a single point failure is to be detected, the receive logic operation may include use of an XOR operation. For a non-limiting implementation where multi-point failures are to be detected, other logical operations may be used.

Per Operation 508, the method may include executing, by the transmit block 202, a second transmit logic operation on the transmit signal TX with respect to the receive signal RX. For a non-limiting implementation where a single point failure is to be detected, the second transmit logic operation may include use of an XOR operation. For a non-limiting implementation where multi-point failures are to be detected, other logical operations may be used.

Per Operation 510, the method may include generating, by the transmit block 202 and based on the executing operation, a result signal (P/F). As discussed above, the result signal (P/F) may indicate, with respect to transient fault detection, whether the first interconnect line 204(A) provides a pass indication "P" or a failure "F" indication. The result signal may be communicated to a third transmit logic 302.

Per Operation 512, the method may include receiving, by a third transmit logic and during a given clock period, the result signal (P/F).

Per Operation 514, the method may include determining, by the third transmit logic 302, whether a failure "F" indication is present in the result signal during the given clock period.

Per Operation 516, the method may include determining, by the third transmit logic 302, whether an ignore signal I is being received during the given period and, when present, resetting the third transmit logic 302.

Per Operation 518, the method may include generating, by the third transmit logic 302, a set/reset signal (R/S) indicating whether, during the given clock period, the failure signal F is received substantially simultaneously with the ignore signal I. As discussed above, the set/reset signal (S/R) may indicate whether the first interconnect line 204(A) passes or fails the diagnostic monitoring for transient faults. The set/reset signal (S/R) may be communicated, by the third transmit logic 302 to a controller component 222 that may be operable to execute a safety protocol in view of a failure of the diagnostic monitoring.

It is to be appreciated that the principles of the various implementations of the present disclosure described herein may be applied to non-safety related vehicle systems and components. For example, isolation may be provided between a safety related component and a non-safety related component. It is also to be appreciated that the principles of the various implementations are not limited to vehicle systems and may be used in conjunction with other systems including, and are not limited to, aircraft and rail systems, industrial processes, and others.

Although various implementations have been described above with a certain degree of particularity, or with reference to one or more individual implementations, those skilled in the art could make numerous alterations to the disclosed implementations without departing from the spirit or scope hereof. The use of the terms "approximately" or "substantially" means that a value of an element has a parameter that is expected to be close to a stated value or position. As is well known in the art, there may be minor variations that prevent the values from being exactly as stated. Accordingly, anticipated variances, such as 10% differences, are reasonable variances that a person having ordinary skill in the art would expect and know are acceptable relative to a stated or ideal goal for one or more implementations of the present disclosure. It is also to be appreciated that the terms "top" and "bottom", "left" and "right", "up" or "down", "first", "second", "next", "last", "before", "after", and other similar terms are used for description and ease of reference purposes and are not intended to be limiting to any orientation or configuration of any elements or sequences of operations for the various implementations of the present disclosure. Further, the terms "coupled", "connected" or otherwise are not intended to limit such interactions and communication of signals between two or more devices, systems, components or otherwise to direct interactions; indirect couplings and connections may also occur. Further, the terms "and" and "or" are not intended to be used in a limiting or expansive nature and cover any possible range of combinations of elements and operations of an implementation of the present disclosure. Other implementations are therefore contemplated. It is intended that the matter contained in the above description and shown in the accompanying drawings shall be interpreted as illustrative of implementations and not limiting. Changes in detail or structure may be made without departing from the basic elements as defined in the following claims.

What is claimed is:

1. A method, for monitoring of interconnect lines, comprising:
   transmitting, by a transmit block to a receive block, a first signal over a first interconnect line and a second signal over a second interconnect line;
   executing, by the transmit block, a first transmit logic operation on the first signal with respect to the second signal to generate a transmit signal;
   receiving, by the transmit block, a receive signal resulting from a receive logic operation executed by the receive block on the first signal with respect to the second signal;
   executing, by the transmit block, a second transmit logic operation on the transmit signal with respect to the receive signal; and
   generating, by the transmit block and based on the executing of the second transmit logic operation, a result signal.

2. The method of claim 1, wherein:
   the first interconnect line and the second interconnect line form an interconnect bus coupling the transmit block with the receive block; and
   the method facilitates detection of permanent faults on the interconnect bus.

3. The method of claim 1, further comprising:
   delaying execution of the second transmit logic operation for at least two or more clock periods.

4. The method of claim 1, wherein:
   the first transmit logic operation comprises an Exclusive OR (XOR) operation;
   the receive logic operation comprises a second XOR operation; and
   the second transmit logic operation comprises a third XOR operation.

5. The method of claim 1, wherein:
   the first transmit logic operation is executed using the first signal and the second signal;
   the receive logic operation is executed using the first signal and the second signal; and
   the second transmit logic operation is executed using the first signal and the second signal.

6. The method of claim 1, further comprising:
   debouncing the result signal a given number of clock periods, the debouncing configured to filter failure indicators out of the result signal for the given number of clock periods.

7. The method of claim 6, wherein:
   the first interconnect line comprises a long interconnect line; and
   the debouncing of the result signal is configured to account for a round-trip signal propagation delay arising over the first interconnect line.

8. The method of claim 1, wherein the first interconnect line provides data signals which facilitate operation of at least one safety component.

9. The method of claim 8, wherein:
   the first interconnect line comprises a metal interconnect; and
   compliance with ASIL-D safety requirement is satisfied for the at least one safety component.

10. The method of claim 1, wherein:
the transmit block comprises a digital block; and
the receive block comprises an analog block.

11. A method, for monitoring interconnect lines, comprising:
transmitting, by a transmit block to a receive block, a first signal over a first interconnect line;
executing, by the transmit block, a first transmit logic operation on the first signal with respect to a second signal on at least one second interconnect line to generate a transmit signal;
receiving, by the transmit block, a receive signal resulting from a receive logic operation executed by the receive block on a received first signal on the first interconnect line with respect to a received second signal received on the at least one second interconnect line;
executing, by the transmit block, a second transmit logic operation on the transmit signal with respect to the receive signal;
generating, by the transmit block and based on the executing of the second transmit logic operation, a result signal;
receiving, by a third transmit logic and during a given clock period, the result signal;
determining, by the third transmit logic, whether a failure indication is present in the result signal during the given clock period;
determining, by the third transmit logic, whether an ignore signal is being received by the third transmit logic during the given clock period, and when the ignore signal is present, resetting the third transmit logic; and
generating, by the third transmit logic, a set/reset signal indicating whether, during the given clock period, the ignore signal is not present while the failure indication is present in the result signal.

12. The method of claim 11, wherein:
the first transmit logic operation is configured to execute an exclusive OR (XOR) operation;
the receive logic operation is configured to execute a second XOR operation;
the second transmit logic operation is configured to execute a third XOR operation; and
the third transmit logic is configured to execute a set/reset latch operation.

13. The method of claim 11, wherein:
the first interconnect line and the at least one second interconnect line form an interconnect bus coupling the transmit block with the receive block; and
the method facilitates detection of transient faults on the interconnect bus.

14. The method of claim 11, wherein the first interconnect line includes a long interconnect line,
the method further comprising:
delaying, for at least two or more clock periods, a providing of the ignore signal to the third transmit logic, the delaying of the providing of the ignore signal to the third transmit logic is configured to account for a round-trip signal propagation delay arising over the first interconnect line and a return path.

15. The method of claim 11, wherein the first interconnect line provides data signals which facilitate operation of at least one safety component.

16. The method of claim 15, wherein:
the first interconnect line comprises a metal interconnect; and
compliance with an Automotive Safety Integrity Level D (ASIL-D) safety requirement is satisfied for the at least one safety component.

17. A system, for monitoring of interconnect lines, comprising:
a transmit block including a first transmit logic and a second transmit logic;
a receive block including a receive logic; and
an interconnect bus coupling the transmit block with the receive block and including:
a first interconnect line; and
a second interconnect line,
the second transmit logic configured to detect a fault on the first interconnect line by comparing a transmit signal with a receive signal,
the transmit signal is generated by the transmit block using the first transmit logic,
the receive signal is generated by the receive block using the receive logic, and
the fault is detected by the second transmit logic when, for a given clock period, the transmit signal and the receive signal do not correspond.

18. The system of claim 17, wherein:
the first transmit logic is configured to generate the transmit signal by comparing a first reference signal for the first interconnect line with a second reference signal for the second interconnect line; and
the receive logic is configured to generate the receive signal by comparing a first data on the first interconnect line with a second data on the second interconnect line.

19. The system of claim 18, wherein:
the first interconnect line further includes a long interconnect line; and
the transmit block further includes a debouncer circuit configured to filter failure indicators out of a result signal for two or more clock periods.

20. The system of claim 19, wherein:
the first transmit logic is configured to execute a first Exclusive OR (XOR) operation to compare the first reference signal with the second reference signal and generate the transmit signal;
the receive logic is configured to execute a third XOR operation to compare the first data with the second data to generate the receive signal; and
the second transmit logic is configured to execute a second XOR operation to compare the transmit signal with the receive signal and generate the result signal.

* * * * *